United States Patent
Chou et al.

(10) Patent No.: US 8,927,986 B2
(45) Date of Patent: Jan. 6, 2015

(54) P-TYPE METAL OXIDE SEMICONDUCTOR

(71) Applicant: Industrial Technology Research Institute, Hsinchu (TW)

(72) Inventors: Tzu-Chi Chou, Taichung (TW); Kuo-Chuang Chiu, Hsinchu (TW); Show-Ju Peng, Zhubei (TW); Shan-Haw Chiou, Hsinchu (TW); Yu-Tsz Shie, Hengshan Township, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/039,188

(22) Filed: Sep. 27, 2013

(65) Prior Publication Data
US 2014/0091302 A1   Apr. 3, 2014

(30) Foreign Application Priority Data
Sep. 28, 2012  (TW) ............................. 101135764 A

(51) Int. Cl.
H01L 29/10  (2006.01)
H01L 29/12  (2006.01)

(52) U.S. Cl.
CPC ..................... *H01L 29/12* (2013.01)
USPC .............................. 257/43; 257/750; 257/762

(58) Field of Classification Search
CPC .............. H01L 29/242; H01L 29/7869; H01L 27/1225; H01L 29/12
USPC .............. 257/43, 750, 762, E39.01, E33.064, 257/E29.296, E21.006, E21.078
See application file for complete search history.

(56) References Cited

U.S. PATENT DOCUMENTS

| 8,007,694 | B2 | 8/2011 | Chiu et al. |
| 8,098,006 | B2 | 1/2012 | Ishizaki et al. |
| 2003/0122122 | A1 | 7/2003 | Iwata |
| 2004/0235214 | A1 | 11/2004 | Burgener, II et al. |
| 2006/0255351 | A1 | 11/2006 | Ryu et al. |
| 2007/0114528 | A1* | 5/2007 | Herman et al. ................. 257/43 |
| 2007/0194379 | A1 | 8/2007 | Hosono et al. |
| 2008/0233670 | A1 | 9/2008 | Choi et al. |
| 2009/0045397 | A1* | 2/2009 | Iwasaki .......................... 257/43 |
| 2010/0320458 | A1 | 12/2010 | Umeda et al. |

FOREIGN PATENT DOCUMENTS

| CN | 102354658 A | 2/2012 |
| JP | 2011-181722 A | 9/2011 |
| TW | 200833852 A | 8/2008 |
| TW | 200932683 A | 8/2009 |

(Continued)

OTHER PUBLICATIONS

Chiu et al., "Fabrication of p-type Li-Doped ZnO Films by RF Magnetron Sputtering," J. Amer. Ceram. Soc., vol. 93, No. 7, pp. 1860-1862 (2010).

(Continued)

*Primary Examiner* — Colleen A Matthews
*Assistant Examiner* — Quovaunda V Jefferson
(74) *Attorney, Agent, or Firm* — Muncy, Geissler, Olds & Lowe, P.C.

(57) ABSTRACT

The disclosure provides a p-type metal oxide semiconductor material. The p-type metal oxide semiconductor material has the following formula:

$In_{1-x}Ga_{1-y}M_{x+y}ZnO_{4+m}$, wherein M is Ca, Mg, or Cu, $0<x+y\leq 0.1$, $0\leq m\leq 3$, and $0<x$, $0\leq y$, or $0\leq x$, $0<y$, and wherein a hole carrier concentration of the p-type metal oxide semiconductor material is in a range of $1\times10^{15}\sim 6\times10^{19}$ cm$^{-3}$.

6 Claims, 5 Drawing Sheets

(56) References Cited

FOREIGN PATENT DOCUMENTS

| TW | 201021096 A | 6/2010 |
|---|---|---|
| TW | 201024224 A | 7/2010 |
| WO | WO 2008/097117 A1 | 8/2008 |

OTHER PUBLICATIONS

Joseph et al., "p-Type Electrical Conduction in ZnO Thin Films by Ga and N Codoping," Jpn. J. Appl. Phys., vol. 38, pp. L1205-L1207 (1999).

Kobayashi et al., "Possibility for hole doping into amorphous InGaZnO$_4$ films prepared by RF Sputtering," Phys. Status Solidi C, vol. 8, No. 2, pp. 531-533 (2011).

Yang et al., "Fabrication of p-Type ZnO Thin Films via DC Reactive Magnetron Sputtering by Using Na as the Dopant Source," J. of Electron. Mat., vol. 36, No. 4, pp. 498-501 (2007).

Hideo Hosono, "Ionic Amorphous Oxide Semiconductors: Material Design, Carrier Transport, and Device Application," J. of Non-Crystalline Solids, vol. 352, pp. 851-858.

Nomura et al., "Room-temperature Fabrication of Transparent Flexible Thin-Film Transistors using Amorphous Oxide Semiconductors," Nature, vol. 432, pp. 488-492 (2004).

Narushima et al., "A p-Type Amorphous Oxide Semiconductor and Room Temperature Fabrication of Amorphous Oxide p-n Heterojunction Diodes," Adv. Mater., vol. 15, No, 17, pp. 1409-1413 (2003).

Kamiya et al., "Electrical Properties and Structure of p-Type Amorphous Oxide Semiconductor xZnO•Rh$_2$O$_3$," Adv. Funct. Mater., vol. 15, pp. 968-974 (2005).

Nomura et al., "Amorphous Oxide Semiconductors for High-Performance Flexible Thin-Film Transistors," J. of Appl. Phys., vol. 45, No. 5B, pp. 4303-4308 (2006).

Chiu et al., "Effects of Processing Parameters on Electrical Properties of p-Type Li-Doped ZnO Films by DC Pulsed Sputtering," J. Am. Ceram. Soc., vol. 94, No. 11, pp. 3711-3715 (2011).

Taiwanese Office Action dated Sep. 18, 2014, as issued in corresponding Taiwan Patent Application No. 102134951.

* cited by examiner

P-TYPE METAL OXIDE SEMICONDUCTOR

CROSS REFERENCE TO RELATED APPLICATION

The present application is based on, and claims priority from, Taiwan Application Serial Number 101135764, filed Sep. 28, 2012, the disclosure of which is hereby incorporated by reference herein in its entirety.

TECHNICAL FIELD

The technical field relates to a p-type metal oxide semiconductor material, and in particular to a p-type indium gallium zinc oxide (IGZO)-based metal oxide semiconductor material.

BACKGROUND

With the rapid development of display technology, a variety of new-age products and materials have emerged. In these products, the transparent display and its related technology have received much attention in recent years due to advantages such as transparency and product interactivity. Among them, indium gallium zinc oxide (IGZO) is a metal oxide semiconductor material that can be applied to the manufacturing of transparent thin film transistors. Compared with the thin film transistors manufactured by amorphous silicon, the thin film transistors manufactured by transparent IGZO-based metal oxide semiconductor material can provide smaller thin film transistor size, higher aperture ratio, superior refinement, improved resolution, and higher carrier mobility (for example, electron mobility). Moreover, simple external circuits may be integrated into the display such that the electronic devices may be lighter and thinner and save more power.

Through the combination of n-type transparent IGZO-based metal oxide semiconductor materials and p-type transparent IGZO-based metal oxide semiconductor materials, not only applications such as transparent complementary metal oxide semiconductors (CMOS) and transparent smart windows may be achieved, but also devices such as inverters and light-emitting diodes (LEDs) may be manufactured in a transparent state. However, currently developed transparent IGZO-based metal oxide semiconductor materials are basically n-type transparent IGZO-based metal oxide semiconductor materials.

Therefore, a novel p-type transparent IGZO-based metal oxide semiconductor material that can solve the above issues and provide transparent metal oxide semiconductor more applied aspects is required.

SUMMARY

One of the broader forms of the present disclosure involves a p-type metal oxide semiconductor material having the following formula:

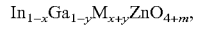

wherein M is Ca, Mg, or Cu, 0<x+y≤0.1, 0≤m≤3, and 0<x, 0≤y, or 0≤x, 0<y, and wherein a hole carrier concentration of the p-type metal oxide semiconductor material is in a range of $1\times10^{15}\sim6\times10^{19}$ cm$^{-3}$.

A detailed description is given in the following embodiments with reference to the accompanying drawings.

BRIEF DESCRIPTION OF DRAWINGS

The present disclosure can be more fully understood by reading the subsequent detailed description and examples with references made to the accompanying drawings, wherein.

DETAILED DESCRIPTION

In the following detailed description, for purposes of explanation, numerous specific details are set forth in order to provide a thorough understanding of the disclosed embodiments and accompanying drawings. The inventive concept may be embodied in various forms without being limited to the exemplary embodiments and drawings set forth herein. Descriptions of well-known parts are omitted for clarity.

One embodiment of the present disclosure provides a p-type metal oxide semiconductor material having the following formula:

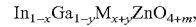

wherein M is Ca, Mg, or Cu, 0<x+y≤0.1, 0≤m≤3, and 0<x, 0≤y, or 0≤x, 0<y, and wherein a hole carrier concentration of the p-type metal oxide semiconductor material is in a range of $1\times10^{15}\sim6\times10^{19}$ cm$^{-3}$.

In the embodiments of the present disclosure, conditions for forming p-type IGZO-based metal oxide semiconductor materials doped with dopants including Ca, Mg, or Cu are obtained by preliminary simulation and calculation procedures. Next, the p-type IGZO-based metal oxide semiconductor materials doped with dopants including Ca, Mg, or Cu are synthesized via a soft chemistry process.

Such simulation and calculation procedures are described as follows. In the present disclosure, Vienna Ab-initio Simulation Package (VASP) is involved in the calculation of the variation of density of states (DOS) to energy in the IGZO-based metal oxide semiconductor materials doped with different dopants, and the results are shown in FIGS. 1A-1F.

Figure 1A:
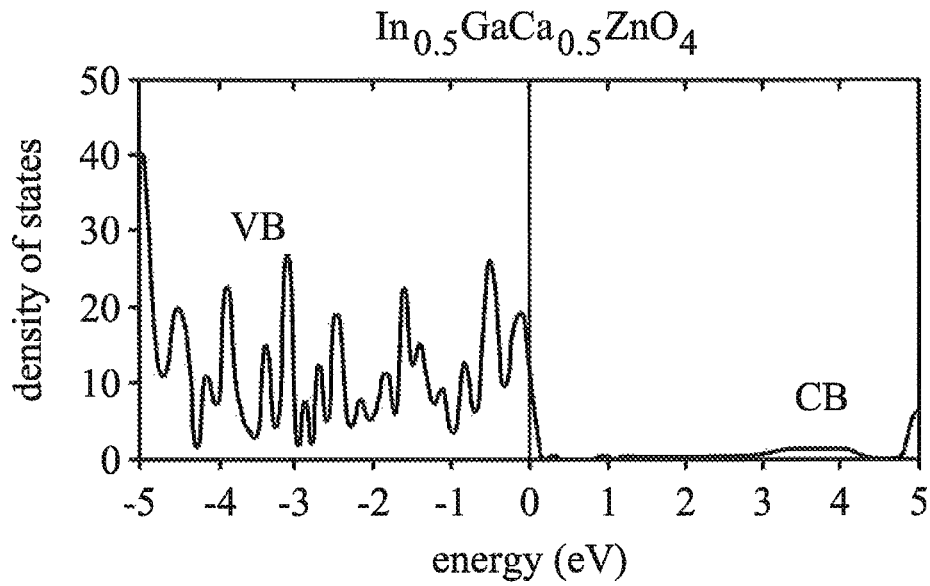
FIGS. 1A-1F show examples of simulation and calculation results of the IGZO-based metal oxide semiconductor materials doped with different dopants according to exemplary embodiments of the present disclosure.
Figure 1B:
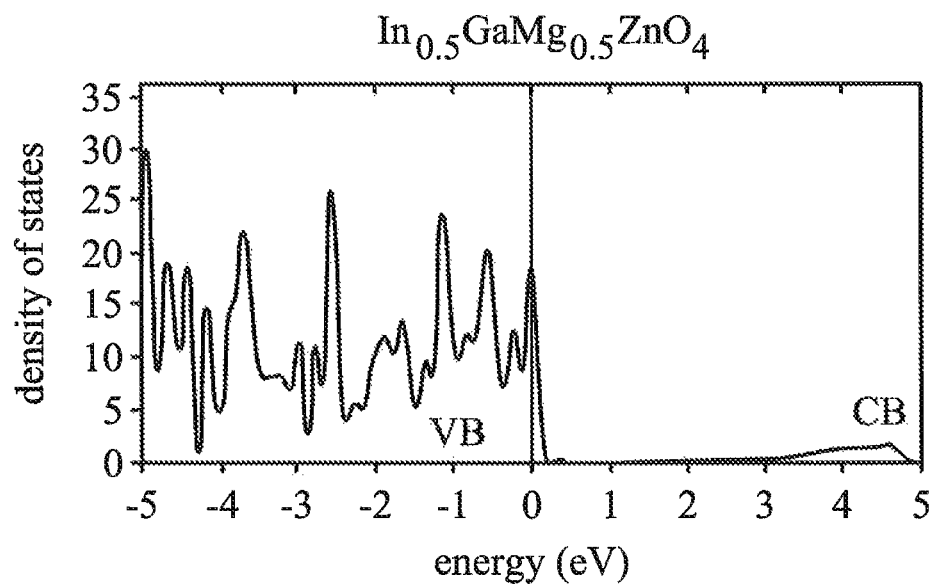
Figure 1C:
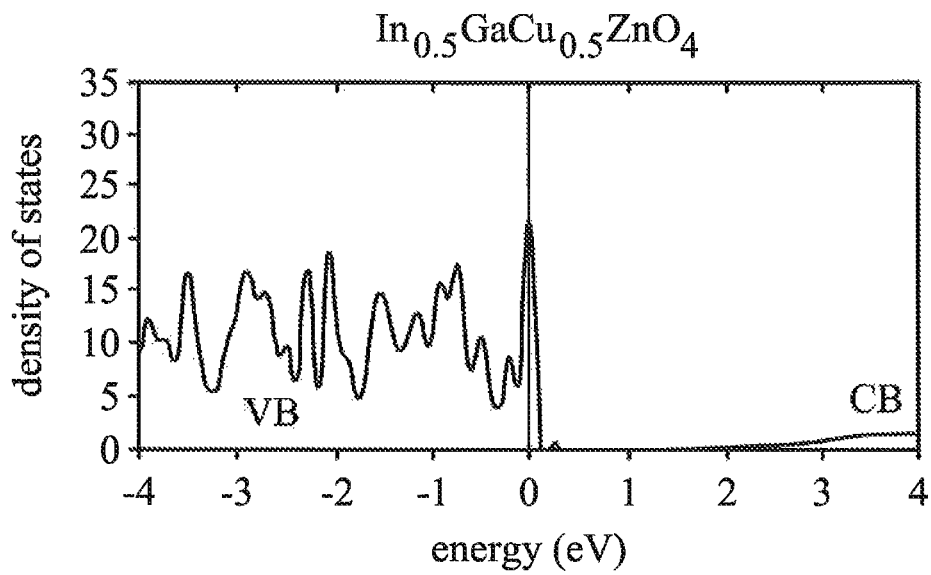

FIG. 1A shows an exemplary density of states versus energy graph of the Ca-doped IGZO-based metal oxide semiconductor material obtained through the VASP simulation and calculation procedures. Through the simulation and calculation procedures, it is known that the Fermi level (EF) of the Ca-doped IGZO-based metal oxide semiconductor material shifts to the valence band (VB), therefore the Ca-doped IGZO-based metal oxide semiconductor material is a p-type metal oxide semiconductor material. It is noted that half of the In atoms in the IGZO-based metal oxide semiconductor material are designated to be substituted with Ca atoms (i.e., $In_{0.5}GaCa_{0.5}ZnO_4$). In practice, when carrying out a simulation and calculation procedure, a preliminary calculation of a selected dopant is usually carried out under the condition of "half substitution" to avoid problems such as excessive amounts of data and a long calculation time. After confirming the preliminary calculation result, a synthesis process is performed with adjusted dopant content to verify the preliminary calculation result. It does not mean that the IGZO-based metal oxide semiconductor material would not show the properties of a p-type semiconductor unless it is under the condition of "half substitution". FIGS. 1B-1C respectively show the simulation and calculation results of the Mg-doped IGZO-based metal oxide semiconductor material and the Cu-doped IGZO-based metal oxide semiconductor material obtained through the VASP simulation and calculation procedures, wherein half of the In atoms in the IGZO-based metal oxide semiconductor material are designated to be substituted with Mg atoms (i.e., $In_{0.5}GaMg_{0.5}ZnO_4$) in the Mg-doped IGZO-based metal oxide semiconductor material and half In atoms in the IGZO-based metal oxide semiconductor material are designated to be substituted with Cu atoms (i.e., $In_{0.5}GaCu_{0.5}ZnO_4$) in the Cu-doped IGZO-based metal oxide semiconductor material. According to the simulation and calculation results shown in FIGS. 1B-1C, it is known that the Fermi level of the Mg-doped IGZO-based metal oxide semiconductor material in which Mg atoms substitute for half of the In atoms and Cu-doped IGZO-based metal oxide semiconductor material in which Cu atoms substitute for half In atoms shift to the valence band, therefore the Mg-doped IGZO-based metal oxide semiconductor material and the Cu-doped IGZO-based metal oxide semiconductor material are also p-type metal oxide semiconductor materials.

Figure 1D:
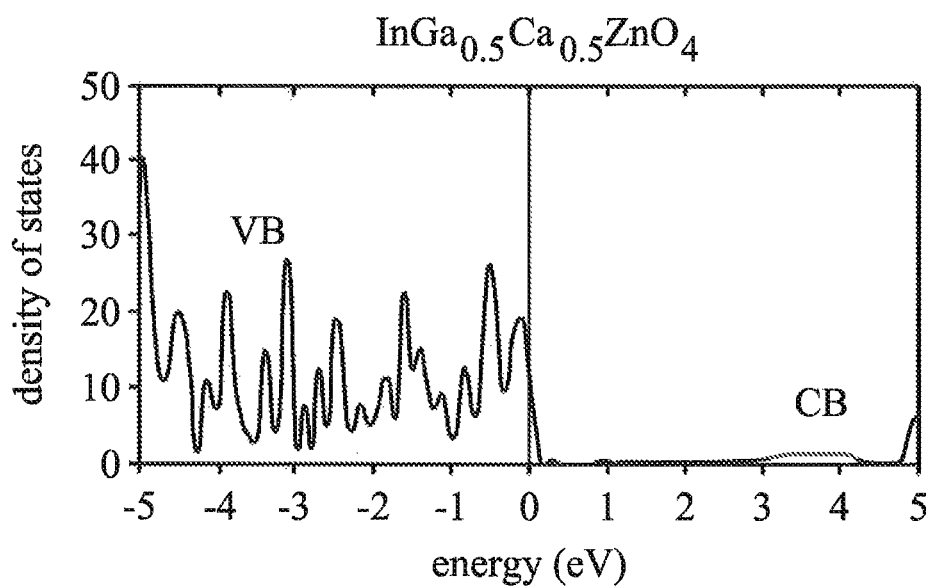
Figure 1E:
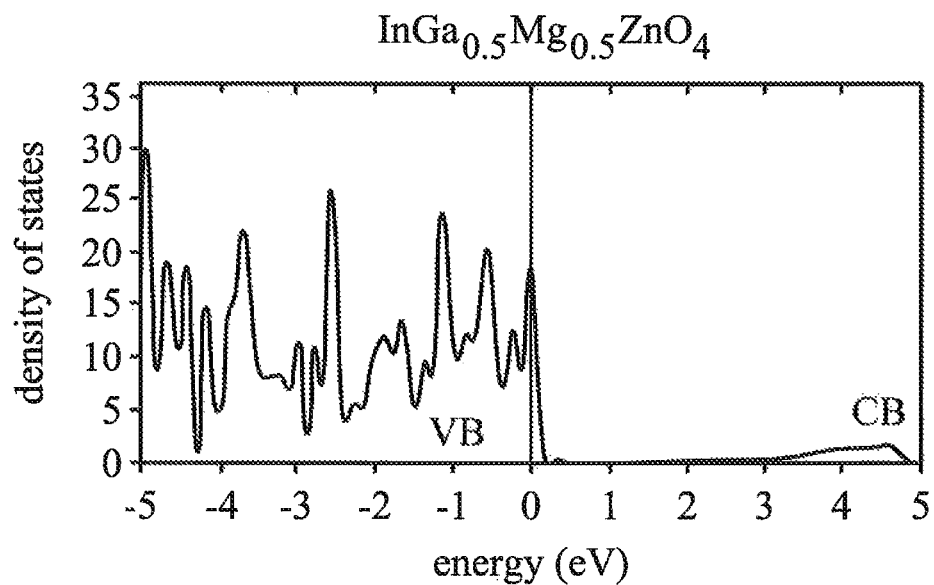
Figure 1F:
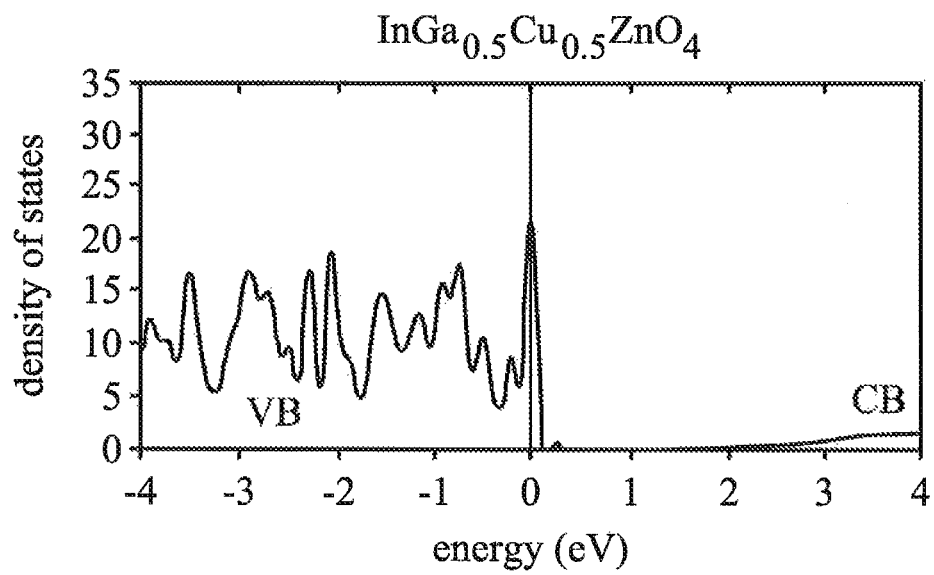

FIGS. 1D-1F show the simulation and calculation results of the Ca, Mg or Cu doped IGZO-based metal oxide semiconductor material obtained through the VASP simulation and calculation procedures. However, half of the Ga atoms in the IGZO-based metal oxide semiconductor material are designated to be substituted with Ca atoms (i.e., $InGa_{0.5}Ca_{0.5}ZnO_4$) in the Ca-doped IGZO-based metal oxide semiconductor material, half Ga atoms in the IGZO-based metal oxide semiconductor material are designated to be substituted with Mg atoms (i.e., $InGa_{0.5}Mg_{0.5}ZnO_4$) in the Mg-doped IGZO-based metal oxide semiconductor material and half of the Ga atoms in the IGZO-based metal oxide semiconductor material are designated to be substituted with Cu atoms (i.e., $InGa_{0.5}Cu_{0.5}ZnO_4$) in the Cu-doped IGZO-based metal oxide semiconductor material. According to the simulation and calculation results shown in FIGS. 1D-1F, it is known that in the Ca-doped IGZO-based metal oxide semiconductor material in which Ca atoms substitute for half of the Ga atoms; the Mg-doped IGZO-based metal oxide semiconductor material in which Mg atoms substitute for half of the Ga atoms; and the Cu-doped IGZO-based metal oxide semiconductor material in which Cu atoms substitute for half of the Ga atoms, the Fermi level shifts to the valence band, and therefore they are also p-type metal oxide semiconductor materials.

Next, the IGZO-based metal oxide semiconductor materials doped with different Ca, Mg, and Cu content are respectively synthesized via a soft chemistry process based on the simulation and calculation results.

In one embodiment, the synthesis process is performed by mixing (1−x) molar parts indium salt, (1−y) molar parts gallium salt, 1 molar part zinc salt, (x+y) molar parts doping metallic salt (for example, Ca, Mg, or Cu salt) and a chelating agent in a solution, wherein 0<x+y≤0.1, 0<x, 0≤y or 0≤x, 0<y, and stirring the solution at room temperature for 60-70 minutes, to form a solution including complexes of In, Ga, Zn, and the doping metal. The metal salts may use nitrates or citrates of In, Ga, Zn, or the doping metal. The chelating agent may use tartaric acid. Then, the temperature is raised to 155-175° C. to evaporate the liquids contained in the solution, and the solution turns into a gel state. The gel is dried to form a powder. A sintering process is performed to oxidize the metal complex to form a metal oxide powder. Related processes such as compression molding, injection molding, cold isostatic press (CIP) and slip casting may be subsequently performed, and a sintering process and a machining process may also be performed to manufacture bulks or targets of the doped IGZO-based metal oxide semiconductor material (for example,

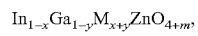

$In_{1−x}Ga_{1−y}M_{x+y}ZnO_{4+m}$, wherein M is Ca, Mg, or Cu, 0<x+y≤0.1, 0≤m≤3, and 0<x, 0≤y, or 0≤x, 0<y).

After manufacturing the bulks or targets, a thin doped IGZO-based metal oxide semiconductor film may be formed by a sputtering process or the like and then be involved in the manufacturing of electronic devices (for example, transparent displays, transparent field effect transistors, light emitting diodes, or transparent integrated circuit semiconductor devices).

Embodiments 1-7

Ca-Doped IGZO-Based Metal Oxide Semiconductor Material in which Ca Atoms Substitute for In Atoms First, under the condition of 0.5 mol total metal content, 0.167 mol Ga salt ($Ga(NO_3)_3$), 0.167 mol Zn salt ($Zn(NO_3)_2$), and In salt ($In(NO_3)_3$) and Ca salt ($Ca(NO_3)_2$) with different proportions according to the chemical doses shown in TABLE 1 are added into a 1.4 N nitric acid ($HNO_3$) solution, 0.55 mol tartaric acid is also added into the solution to act as a chelating agent. The solution is stirred at room temperature for 1 hour for the synthesis of embodiments 1-7 of the present disclosure. After the precipitation of the mixed metallic ions, a metal complex is formed by combining In, Ga, Zn and Ca with the chelating agent.

Subsequently, the temperature is raised to 155° C. to evaporate the liquid contained in the solution, and the solution turns into a gel state. The gel is dried to form a powder. A sintering process is performed to oxidize the metal complex to form a metal oxide semiconductor powder. The metal oxide semiconductor has a formula of

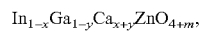

$In_{1−x}Ga_{1−y}Ca_{x+y}ZnO_{4+m}$, wherein 0.0005≤x≤0.1, y=0, 0≤m≤3.

Next, a ceramic process such as compression molding, injection molding, cold isostatic press (CIP) or slip casting is performed to manufacture bulks or targets of the Ca-doped IGZO-based metal oxide semiconductor material in which Ca atoms substitute for In atoms.

Through performing an energy-dispersive X-ray spectroscopy (EDS) analysis on the bulks or the targets of the Ca-doped IGZO-based metal oxide semiconductor, the content of the constituent elements can be obtained. The content (molar ratio) of the metallic constituent elements in the Ca-doped IGZO-based metal oxide semiconductor material is shown in TABLE 1. On the other hand, the content (molar ratio) of the non-metallic constituent element (for example, O) in the Ca-doped IGZO-based metal oxide semiconductor material in embodiments 1-7 is 4+m, wherein 0≤m≤3. For example, in embodiment 5, the molar ratio of the constituent elements in the Ca-doped IGZO-based metal oxide semiconductor material is In:Ca:Ga:Zn:O=0.995:0.005:1:1:6, which is obtained through performing the energy-dispersive X-ray spectroscopy analysis.

Figure 2:
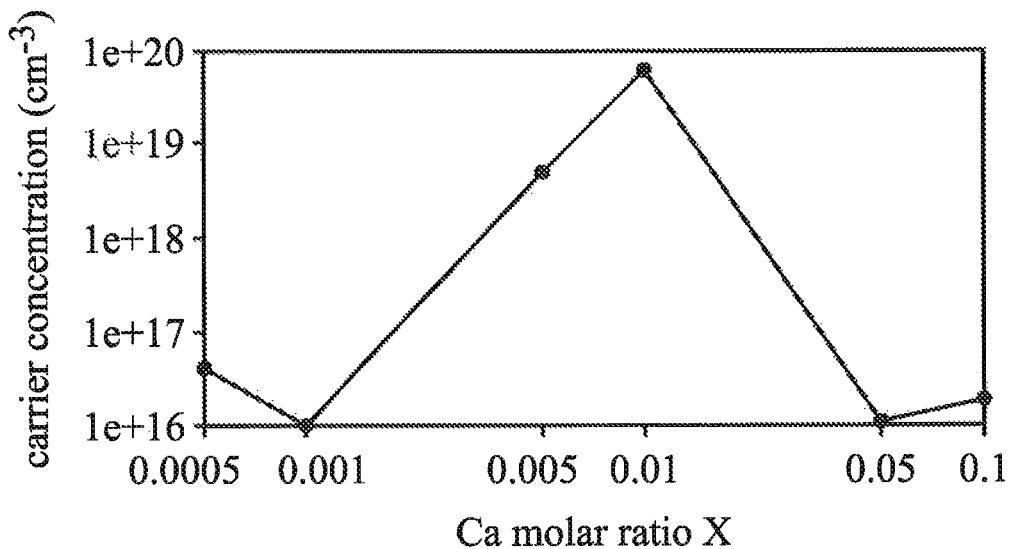
FIG. 2 shows an example of the measured results of the hole carrier concentration of the Ca-doped IGZO-based metal oxide semiconductor materials in which Ca atoms substitute for In atoms according to exemplary embodiments of the present disclosure.
Figure 3:
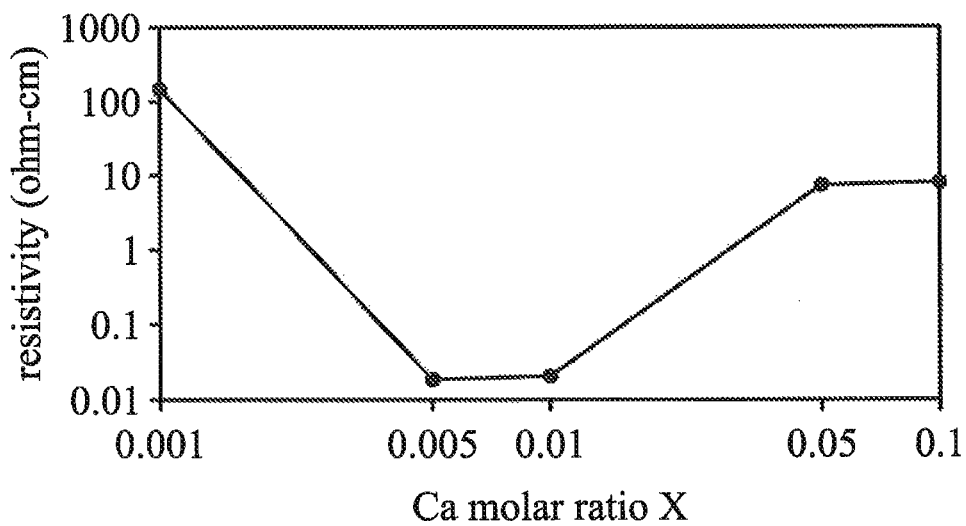
FIG. 3 shows an example of the measured results of the resistivity of the Ca-doped IGZO-based metal oxide semiconductor materials in which Ca atoms substitute for In atoms according to exemplary embodiments of the present disclosure.
Figure 4:
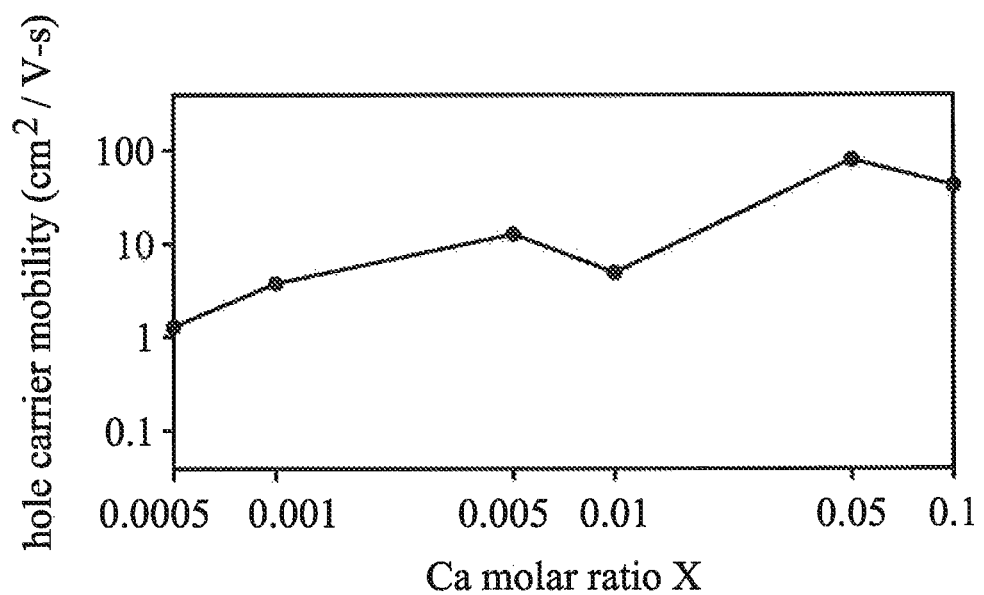
FIG. 4 shows an example of the measured results of the hole carrier mobility of the Ca-doped IGZO-based metal oxide semiconductor materials in which Ca atoms substitute for In atoms according to exemplary embodiments of the present disclosure.

Moreover, through performing a Hall measurement on the bulks or the targets of the Ca-doped IGZO-based metal oxide semiconductor material, properties such as majority carrier type, carrier concentration and resistivity of the Ca-doped IGZO-based metal oxide semiconductor material can be obtained, as shown in TABLE 1 and FIGS. 2-4. The Hall measurement is performed by HL 5550 LN2 Cryostat Hall Effect Measurement Setup manufactured by Nano Metrics.

TABLE 1

| embodiment | content (mol) Ca | content (mol) In | molar ratio of the metallic constituent elements (In:Ca:Ga:Zn) | majority carrier type |
|---|---|---|---|---|
| Embodiment 1 | 0.0167 | 0.1500 | 0.9:0.1:1:1 | P |
| Embodiment 2 | 0.0083 | 0.1583 | 0.95:0.05:1:1 | P |
| Embodiment 3 | 0.0042 | 0.1625 | 0.975:0.025:1:1 | P |
| Embodiment 4 | 0.0017 | 0.1650 | 0.99:0.01:1:1 | P |
| Embodiment 5 | 0.0008 | 0.1658 | 0.995:0.005:1:1 | P |
| Embodiment 6 | 0.00017 | 0.1665 | 0.999:0.001:1:1 | P |
| Embodiment 7 | 0.000083 | 0.1666 | 0.9995:0.0005:1:1 | P |

TABLE 1 shows the content (molar ratio) of the metallic constituent elements add the majority carrier types in the Ca-doped IGZO-based metal oxide semiconductor material in embodiments 1-7 of the present disclosure. FIG. 2 shows the measured results of hole carrier concentration in the Ca-doped IGZO-based metal oxide semiconductor materials. According to FIG. 2, the majority carrier type measured by Hall measurement is hole and the hole carrier concentration is in a range of $1 \times 10^{15} \sim 6 \times 10^{19}$ cm$^{-3}$, which falls within the carrier concentration range of a semiconductor when Ca atoms substitute for In atoms in the IGZO-based metal oxide semiconductor materials (i.e., $In_{1-x}Ga_{1-y}Ca_{x+y}ZnO_{4+m}$, wherein $0.0005 \leq x \leq 0.1$, y=0, $0 \leq m \leq 3$). Therefore, the Ca-doped IGZO-based metal oxide semiconductor materials in embodiments 1-7 are p-type.

FIG. 3 shows the measured results of resistivity of the Ca-doped IGZO-based metal oxide semiconductor materials in the embodiments. According to FIG. 3, the resistivity is in a range of $0.89 \times 10^{-2} \sim 1.44 \times 10^{2}$ ohm-cm when Ca atoms substitute for In atoms in the IGZO-based metal oxide semiconductor materials (i.e., $In_{1-x}Ga_{1-y}Ca_{x+y}ZnO_{4+m}$, wherein $0.0005 \leq x \leq 0.1$, y=0, $0 \leq m \leq 3$). FIG. 4 shows the measured results of hole carrier mobility of the Ca-doped IGZO-based metal oxide semiconductor materials in the embodiments. As shown in FIG. 4, the measured hole carrier mobility is greater than about 1.0 cm$^2$/V-s when Ca atoms substitute for In atoms in the IGZO-based metal oxide semiconductor materials (i.e., $In_{1-x}Ga_{1-y}Ca_{x+y}ZnO_{4+m}$, wherein $0.0005 \leq x \leq 0.1$, y=0, $0 \leq m \leq 3$). Therefore, according to the method disclosed by the present disclosure, a p-type IGZO-based metal oxide semiconductor material with excellent electrical properties can be obtained.

Embodiments 8-9

Mg-Doped IGZO-Based Metal Oxide Semiconductor Material in which Mg Atoms Substitute for In Atoms First, under the condition of 0.5 mol total metal content, 0.167 mol Ga salt (Ga(NO$_3$)$_3$), 0.167 mol Zn salt (Zn(NO$_3$)$_2$), and In salt (In(NO$_3$)$_3$) and Mg salt (Mg(NO$_3$)$_2$) with different proportions according to the chemical doses shown in TABLE 2 are added into a 1.4 N nitric acid (HNO$_3$) solution. 0.55 mol tartaric acid is also added into the solution to act as a chelating agent. The solution is stirred at room temperature for 1 hour for the synthesis of embodiments 8-9 of the present disclosure. After the precipitation of the mixed metallic ions, a metal complex is formed by combining In, Ga, Zn and Mg with the chelating agent.

Subsequently, the temperature is raised to 155° C. to evaporate the liquid contained in the solution, and the solution turns into a gel state. The gel is dried to form a powder. A sintering process is performed to oxidize the metal complex to form a metal oxide semiconductor powder. The metal oxide semiconductor has a formula of $$In_{1-x}Ga_{1-y}ZnO_{4+m},$$ 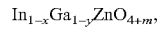

wherein $0.001 \leq x \leq 0.005$, y=0, $0 \leq m \leq 3$.

Next, a ceramic process such as compression molding, injection molding, cold isostatic press (CIP) or slip casting is performed to manufacture bulks or targets of the Mg-doped IGZO-based metal oxide semiconductor material in which Mg atoms substitute for In atoms.

Through performing an energy-dispersive X-ray spectroscopy analysis on the bulks or the targets of the Mg-doped IGZO-based metal oxide semiconductor material, the content (molar ratio) of the metallic constituent element in the Mg-doped IGZO-based metal oxide semiconductor material can be obtained, as shown in TABLE 2, and the content (molar ratio) of non-metallic constituent element (for example, O) in the Mg-doped IGZO-based metal oxide semiconductor material can also be obtained, which is 4+m, wherein $0 \leq m \leq 3$ in embodiments 8-9. Moreover, through performing a Hall measurement on the bulks or the targets of the Mg-doped IGZO-based metal oxide semiconductor material, properties such as majority carrier type of the Mg-doped IGZO-based metal oxide semiconductor material can be obtained, as shown in TABLE 2.

TABLE 2

| embodiment | content (mol) Mg | content (mol) In | molar ratio of the metallic constituent elements (In:Mg:Ga:Zn) | majority carrier type |
|---|---|---|---|---|
| Embodiment 8 | 0.0008 | 0.1658 | 0.995:0.005:1:1 | P |
| Embodiment 9 | 0.00017 | 0.1665 | 0.999:0.001:1:1 | P |

TABLE 2 shows the content (molar ratio) of metallic constituent elements and the majority carrier types in the Mg-doped IGZO-based metal oxide semiconductor material embodiments 8-9 of the present disclosure. The majority carrier type measured by Hall measurement is hole and the hole carrier concentration is greater than 10$^{15}$ cm$^{-3}$ when Mg atoms substitute for In atoms in the IGZO-based metal oxide semiconductor materials (i.e., $In_{1-x}Ga_{1-y}Mg_{x+y}ZnO_{4+m}$, wherein $0.001 \leq x \leq 0.005$, y=0, $0 \leq m \leq 3$). Therefore, the Mg-doped IGZO-based metal oxide semiconductor materials in embodiments 8-9 are p-type, as shown in TABLE 2.

Embodiments 10-12

Cu-Doped IGZO-Based Metal Oxide Semiconductor Material in which Cu Atoms Substitute for In Atoms First, under the condition of 0.5 mol total metal content, 0.167 mol Ga salt (Ga(NO$_3$)$_3$), 0.167 mol Zn salt (Zn(NO$_3$)$_2$), and In salt (In(NO$_3$)$_3$) and Cu salt (Cu(NO$_3$)$_2$) with different proportions according to the chemical doses shown in TABLE 3 are added into a 1.4 N nitric acid (HNO$_3$) solution. 0.55 mol tartaric acid is also added into the solution to act as a chelating agent. The solution is stirred at room temperature for 1 hour for the synthesis of embodiments 10-12 of the present disclosure. After the precipitation of the mixed metallic ions, a metal complex is formed by combining In, Ga, Zn and Cu with the chelating agent.

Subsequently, the temperature is raised to 155° C. to evaporate the liquid contained in the solution, and the solution turns into a gel state. The gel is dried to form a powder. A sintering process is performed to oxidize the metal complex to form a metal oxide semiconductor powder. The metal oxide semiconductor has a formula of $$In_{1-x}Ga_{1-y}Cu_{x+y}ZnO_{4+m},$$

wherein $0.001 \leq x \leq 0.1$, $y=0$, $0 \leq m \leq 3$.

Next, a ceramic process such as compression molding, injection molding, cold isostatic press (CIP) or slip casting is performed to manufacture bulks or targets of the Cu-doped IGZO-based metal oxide semiconductor material in which Cu atoms substitute for In atoms.

Through performing an energy-dispersive X-ray spectroscopy analysis on the bulks or the targets of the Ca-doped IGZO-based metal oxide semiconductor material, the content (molar ratio) of the metallic constituent element in the Cu-doped IGZO-based metal oxide semiconductor material can be obtained, as shown in TABLE 3, and the content (molar ratio) of non-metallic constituent element (for example, O) in the Cu-doped IGZO-based metal oxide semiconductor material can also be obtained, which is 4+m, wherein $0 \leq m \leq 3$ in embodiments 10-12. Moreover, through performing a Hall measurement on the bulks or the targets of the Cu-doped IGZO-based metal oxide semiconductor material, the properties such as majority carrier type of the Cu-doped IGZO-based metal oxide semiconductor material can be obtained, as shown in TABLE 3.

TABLE 3

| embodiment | content (mol) Cu | content (mol) In | molar ratio of the metallic constituent elements (In:Cu:Ga:Zn) | majority carrier type |
|---|---|---|---|---|
| Embodiment 10 | 0.0167 | 0.1500 | 0.9:0.1:1:1 | P |
| Embodiment 11 | 0.0008 | 0.1658 | 0.995:0.005:1:1 | P |
| Embodiment 12 | 0.00017 | 0.1665 | 0.999:0.001:1:1 | P |

TABLE 3 shows the content (molar ratio) of metallic constituent elements and the majority carrier types in the Cu-doped IGZO-based metal oxide semiconductor material in embodiments 10-12 of the present disclosure. The majority carrier type measured by Hall measurement is hole and the hole carrier concentration is greater than $10^{15}$ cm$^{-3}$ when Cu atoms substitutes for In atoms in the IGZO-based metal oxide semiconductor materials (i.e., $In_{1-x}Ga_{1-y}Cu_{x+y}ZnO_{4+m}$, $0.001 \leq x \leq 0.1$, $y=0$, $0 \leq m \leq 3$). Therefore, the Cu-doped IGZO-based metal oxide semiconductor materials in embodiments 10-12 are p-type, as shown in TABLE 3.

Embodiments 13-14

Mg-Doped IGZO-Based Metal Oxide Semiconductor Material in which Mg Atoms Substitute for Ga Atoms First, under the condition of 0.5 mol total metal content, 0.167 mol In salt (In(NO$_3$)$_3$), 0.167 mol Zn salt (Zn(NO$_3$)$_2$), and Ga salt (Ga(NO$_3$)$_3$) and Mg salt (Mg(NO$_3$)$_2$) with different proportions according to the chemical doses shown in TABLE 4 are added into a 1.4 N nitric acid (HNO$_3$) solution. 0.55 mol tartaric acid is also added into the solution to act as a chelating agent. The solution is stirred at room temperature for 1 hour for the synthesis of embodiments 13-14 of the present disclosure. After the precipitation of the mixed metallic ions, a metal complex is formed by combining In, Ga, Zn and Mg with the chelating agent.

Subsequently, the temperature is raised to 155° C. to evaporate the liquid contained in the solution, and the solution turns into a gel state. The gel is dried to form a powder. A sintering process is performed to oxidize the metal complex to form a metal oxide semiconductor powder. The metal oxide semiconductor has a formula of $$In_{1-x}Ga_{1-y}Mg_{x+y}Zn_{4+m},$$

wherein $x=0$, $0.001 \leq y \leq 0.1$, $0 \leq m \leq 3$.

Next, a ceramic process such as compression molding, injection molding, cold isostatic press (CIP) or slip casting is performed to manufacture bulks or targets of the Mg-doped IGZO-based metal oxide semiconductor material in which Mg atoms substitute for Ga atoms.

Through performing an energy-dispersive X-ray spectroscopy analysis on the bulks or the targets of the Mg-doped IGZO-based metal oxide semiconductor material, the content (molar ratio) of the metallic constituent element in the Mg-doped IGZO-based metal oxide semiconductor material can be obtained, as shown in TABLE 4, and the content (molar ratio) of non-metallic constituent element (for example, O) in the Mg-doped IGZO-based metal oxide semiconductor material can also be obtained, which is 4+m, wherein $0 \leq m \leq 3$ in embodiments 13-14. Moreover, through performing a Hall measurement on the bulks or the targets of the Mg-doped IGZO-based metal oxide semiconductor material, the properties such as majority carrier type of the Mg-doped IGZO-based metal oxide semiconductor material can be obtained, as shown in TABLE 4.

TABLE 4

| embodiment | content (mol) Mg | content (mol) Ga | molar ratio of the metallic constituent elements (In:Ga:Mg:Zn) | majority carrier type |
|---|---|---|---|---|
| Embodiment 13 | 0.00017 | 0.1665 | 1:0.999:0.001:1 | P |
| Embodiment 14 | 0.0167 | 0.1500 | 1:0.9:0.1:1 | P |

TABLE 4 shows the content (molar ratio) of metallic constituent elements and the majority carrier types in the Mg-doped IGZO-based metal oxide semiconductor material in embodiments 13-14 of the present disclosure. The majority carrier type measured by Hall measurement is hole and the hole carrier concentration is greater than $10^{15}$ cm$^{-3}$ when Mg atoms substitute for Ga atoms in the IGZO-based metal oxide semiconductor materials (i.e., $In_{1-x}Ga_{1-y}Mg_{x+y}ZnO_{4+m}$, $x=0$, $0.001 \leq y \leq 0.1$, $0 \leq m \leq 3$). Therefore, the Mg-doped IGZO-based metal oxide semiconductor materials in embodiments 13-14 are p-type, as shown in TABLE 4.

Embodiments 15-18

Cu-Doped IGZO-Based Metal Oxide Semiconductor Material in which Cu Atoms Substitute for Ga Atoms First, under the condition of 0.5 mol total metal content, 0.167 mol In salt (In(NO$_3$)$_3$), 0.167 mol Zn salt (Zn(NO$_3$)$_2$), and Ga salt ($Ga(NO_3)_3$) and Cu salt ($Cu(NO_3)_2$) with different proportions according to the chemical doses shown in TABLE 5 are added into a 1.4 N nitric acid ($HNO_3$) solution. 0.55 mol tartaric acid is also added into the solution to act as a chelating agent. The solution is stirred at room temperature for 1 hour for the synthesis of embodiments 15-18 of the present disclosure. After the precipitation of the mixed metallic ions, a metal complex is formed by combining In, Ga, Zn and Cu with the chelating agent.

Subsequently, the temperature is raised to 155° C. to evaporate the liquid contained in the solution, and the solution turns into a gel state. The gel is dried to form a powder. A sintering process is performed to oxidize the metal complex to form a metal oxide semiconductor powder. The metal oxide semiconductor has a formula of $$In_{1-x}Ga_{1-y}Cu_{x+y}ZnO_{4+m},$$

wherein x=0, $0.025 \leq y \leq 0.1$, $0 \leq m \leq 3$.

Next, a ceramic process such as compression molding, injection molding, cold isostatic press (CIP) or slip casting is performed to manufacture bulks or targets of the Cu-doped IGZO-based metal oxide semiconductor material in which Cu atoms substitute for Ga atoms.

Through performing an energy-dispersive X-ray spectroscopy analysis on the bulks or the targets of the Cu-doped IGZO-based metal oxide semiconductor material, the content (molar ratio) of the metallic constituent element in the Cu-doped IGZO-based metal oxide semiconductor material can be obtained, as shown in TABLE 5, and the content (molar ratio) of non-metallic constituent element (for example, O) in the Cu-doped IGZO-based metal oxide semiconductor material can also be obtained, which is 4+m, wherein $0 \leq m \leq 3$ in embodiments 15-18. Moreover, through performing a Hall measurement on the bulks or the targets of the Cu-doped IGZO-based metal oxide semiconductor material, the properties such as majority carrier type of the Cu-doped IGZO-based metal oxide semiconductor material can be obtained, as shown in TABLE 5.

TABLE 5

| embodiment | content (mol) | | molar ratio of the metallic constituent elements | majority carrier |
| | Cu | Ga | (In:Ga:Cu:Zn) | type |
| --- | --- | --- | --- | --- |
| Embodiment 15 | 0.004 | 0.163 | 1:0.975:0.025:1 | P |
| Embodiment 16 | 0.008 | 0.158 | 1:0.95:0.05:1 | P |
| Embodiment 17 | 0.013 | 0.154 | 1:0.925:0.075:1 | P |
| Embodiment 18 | 0.017 | 0.150 | 1:0.9:0.1:1 | P |

TABLE 5 shows the content (molar ratio) of metallic constituent elements and the majority carrier types in the Cu-doped IGZO-based metal oxide semiconductor material in embodiments 15-18 of the present disclosure. The majority carrier type measured by Hall measurement is hole and the hole carrier concentration is greater than $10^{15}$ cm$^{-3}$ when Cu atoms substitute for Ga atoms in the IGZO-based metal oxide semiconductor materials (i.e., $In_{1-x}Ga_{1-y}Cu_{x+y}ZnO_{4+m}$, x=0, $0.025 \leq y \leq 0.1$, $0 \leq m \leq 3$). Therefore, the Cu-doped IGZO-based metal oxide semiconductor materials in embodiments 15-18 are p-type, as shown in TABLE 5.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A p-type metal oxide semiconductor material having the following formula:

$$In_{1-x}Ga_{1-y}M_{x+y}ZnO_{4+m},$$

wherein M is Calcium, Magnesium, or Copper, $0 < x+y \leq 0.1$, $0 \leq m \leq 3$, and $0 < x$, $0 \leq y$, or $0 \leq x$, $0 < y$, and wherein a hole carrier concentration of the p-type metal oxide semiconductor material is in a range of $1 \times 10^{15} \sim 6 \times 10^{19}$ cm$^{-3}$.

2. The p-type metal oxide semiconductor material as claimed in claim 1, wherein M is Calcium, $0.0005 \leq x \leq 0.1$, y=0.

3. The p-type metal oxide semiconductor material as claimed in claim 1, wherein M is Magnesium, $0.001 \leq x \leq 0.005$, y=0.

4. The p-type metal oxide semiconductor material as claimed in claim 1, wherein M is Copper, $0.001 \leq x \leq 0.1$, y=0.

5. The p-type metal oxide semiconductor material as claimed in claim 1, wherein M is Magnesium, x=0, $0.001 \leq y \leq 0.1$.

6. The p-type metal oxide semiconductor material as claimed in claim 1, wherein M is Copper, x=0, $0.025 \leq y \leq 0.1$.

* * * * *